(12) United States Patent
Baumgartner et al.

(10) Patent No.: US 8,627,273 B2
(45) Date of Patent: Jan. 7, 2014

(54) MODEL CHECKING OF LIVENESS PROPERTY IN A PHASE ABSTRACTED MODEL

(75) Inventors: Jason Raymond Baumgartner, Haifa (IL); Shaked Flur, Haifa (IL); Ziv Nevo, Haifa (IL); Paul Joseph Roessler, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 978 days.

(21) Appl. No.: 12/507,099

(22) Filed: Jul. 22, 2009

(65) Prior Publication Data

US 2011/0022373 A1    Jan. 27, 2011

(51) Int. Cl.
*G06F 9/44* (2006.01)
(52) U.S. Cl.
USPC ............ 717/104; 717/105; 717/124; 717/125
(58) Field of Classification Search
USPC .................................. 717/104, 105, 124, 125
See application file for complete search history.

(56) References Cited

U.S. PATENT DOCUMENTS

| | | | |
|---|---|---|---|
| 6,745,377 B2 | 6/2004 | Baumgartner et al. | |
| 6,748,573 B2 | 6/2004 | Baumgartner et al. | |
| 6,763,505 B2 | 7/2004 | Baumgartner et al. | |
| 6,944,838 B2 | 9/2005 | McMillan | |
| 7,343,575 B2 | 3/2008 | Bjesse et al. | |
| 2004/0123254 A1* | 6/2004 | Geist et al. | 716/4 |
| 2006/0253815 A1* | 11/2006 | Bjesse et al. | 716/5 |
| 2009/0064064 A1* | 3/2009 | Eisner et al. | 716/5 |

OTHER PUBLICATIONS

Armin Biere, "Liveness Checking as Safety Checking", published in 2002.*
Horst Samulowitz, "Using SAT in QBF", published in 2005.*
Dimitra Giannakopoulou, "Model Checking for Concurrent Software Architectures", published on Jan. 1999.*
Jason Baumgartner and Hari Mony, "Scalable Liveness Checking via Property-Preserving Transformations" in IBM Systems & Technology Group, Austin, TX, Apr. 2009.*
K. L. McMillan and N. Amla, "Automatic abstraction without counterexamples," in TACAS, Apr. 2004.*
V. Schuppan, "Liveness Checking as Safety Checking to Find Shortest Counterexamples to Linear Time Properties", PhD Thesis, ETH Zürich, 2006.*
H. Samulowitz, J. Davies, F. Bacchus, "Preprocessing QBF", 2006.*
Bjesse, P.; Kukula, J., "Automatic generalized phase abstraction for formal verification", Computer-Aided Design, 2005. ICCAD-2005. IEEE/ACM International Conference on Nov. 6-10, 2005 pp. 1076-1082.

* cited by examiner

*Primary Examiner* — Chat Do
*Assistant Examiner* — Jae Jeon
(74) *Attorney, Agent, or Firm* — Zir Glazberg (57) ABSTRACT

Phase abstraction may be utilized to increase efficiency of model checking techniques. A liveness property may be checked in respect to a phase abstracted model by modifying the liveness property in accordance with the phase abstracted model. A fairness property may be modified to ensure that the fairness property is held by the model checker. A counter-example produced by a model checker is modified to be in accordance to an original model. The counter-example comprises a repetitive behavior. The counter-example may be modified to shorten the repetitive behavior or to apply the repetitive behavior in an earlier cycle of the counter-example.

20 Claims, 5 Drawing Sheets

MODEL CHECKING OF LIVENESS PROPERTY IN A PHASE ABSTRACTED MODEL

BACKGROUND

The present disclosure relates to formal verification in general, and to model checking of liveness properties in particular.

Computerized devices are an important part of the modern life. They control almost every aspect of our life—from writing documents to controlling traffic lights. However, computerized devices are bug-prone, and thus require a testing phase in which the bugs should be discovered. The testing phase is considered one of the most difficult tasks in developing a computerized device. Many developers of computerized devices invest a significant portion, such as 70%, of the development cycle to discover erroneous behaviors of the computerized device, also referred to as a target computerized system. The target computerized system may comprise hardware, software, firmware, a combination thereof and the like.

During the testing phase formal verification techniques may be applied to verify that a predetermined property is held. Formal verification may utilize a model checker to verify that the predetermined property, also referred to as a specification, is held. A model, also referred to as a design, represents a set of Boolean variables and functions for determining their values depending on environment inputs and on a portion of the set of Boolean variables. The Boolean variables are also referred to as registers. The model therefore represents all possible behaviors of the target computerized system over discrete time, also referred to as cycles. A gate in a model represents a portion of the model having a value, such as a variable, an outcome of a function based on values of one or more variables and the like.

The predetermined property may be a safety properties, in case it may be refuted using a finite counter-example. The predetermined property may be a liveness property in case it may only be refuted using an infinite counter-example. For example, a safety property may state that a "bad" event never happens, and be refuted by showing an exemplary finite trace in which the last state comprises the "bad" event occurring; whereas a liveness property may state that a "good" event eventually happens, for example, that "Process A eventually enters the critical section". A refutation of such liveness property may be provided by showing an infinite trace in which the "good" event never occurs.

Some additional exemplary liveness properties may be "starvation freedom", e.g., ensuring that the progress is always made; termination, e.g. ensuring that the final instruction may always be completed; "guaranteed service", e.g. a service may always be eventually serviced and the like.

A counter-example for a liveness property is a description of an infinite behavior of the target computerized system. The infinite behavior is described using a finite number of states which are divided to a prefix and a suffix. The suffix also referred to as a loop or a repetitive portion of the counter-example, represents a repetitive behavior of a finite number of states for which the first state occurs after the last state, and therefore describe an infinite behavior.

In order to insure an "interesting" counter-example, the model may be required to comply with a fairness property. For example, in a model of a priority queue in which a message of high priority is passed before a message of low priority, a liveness property requiring that eventually every low priority message is removed from the queue may be refuted by a scenario in which in every cycle a new high priority message is received. An exemplary fairness property would require the input to provide both low priority and high priority messages.

In order to increase efficiency of the model checker, phase abstraction may be applied on an original model, producing a phase abstracted model. Phase abstraction is a technique that may reduce the size of a model by unfolding the transition relation function of the model, such that the transition relation function of the phase abstracted model represents more than one transitions in the model. Some may view a phase abstracted model as a model in which each cycle represents several cycles in the original model.

BRIEF SUMMARY OF THE INVENTION

One exemplary embodiment of the disclosed subject matter is a computerized system comprising: a processor; an interface for receiving a phase abstracted model; an interface for receiving an original liveness property associated with the original model; and a property modifier for transforming the original liveness property to a phase abstracted liveness property.

Another exemplary embodiment of the disclosed subject matter is a method comprising: retrieving a phase abstracted model, the phase abstracted model is a result of a phase abstraction on an original model; retrieving an original liveness property associated with the original model; and transforming the original liveness property to a phase abstracted liveness property; the transforming the original liveness property is performed using a processor; whereby the original liveness property is transformed to the phase abstracted liveness property that may be checked in respect to the phase abstracted model.

Yet another exemplary embodiment of the disclosed subject matter is a computer program product comprising: a computer readable medium; first program instruction for retrieving a phase abstracted model, the phase abstracted model is a result of a phase abstraction on an original model; second program instruction for retrieving an original liveness property associated with the original model; and third program instruction for transforming the original liveness property to a phase abstracted liveness property; wherein the first, second and third program instructions are stored on the computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to enable model checking of liveness properties in respect to phase abstracted model. Another technical problem dealt with by the disclosed subject matter is to preserve fairness properties in the phase abstracted model in accordance with the original model. Yet another technical problem dealt with by the disclosed subject matter is to provide a counter-example relating to the original model. Yet another technical problem dealt with by the disclosed subject matter is to provide a minimized counter-example, such as that a repetitive portion of the counter-example comprises a relatively small number of cycles or that the repetitive portion begins in the counter-example in a relatively early cycle.

One technical solution is to determine a phase abstracted liveness property in respect to the original liveness property. Another technical solution is to conjunct gates in the phase abstracted model to determine a phase abstracted liveness property. Yet another technical solution is to determine a phase abstracted fairness property in respect to the original fairness property. Yet another technical solution is to disjunct gates in the phase abstracted model to determine a phase abstracted fairness property. Yet another technical solution is to determine a cycle in the original model associated with a cycle in the phase abstracted model in which a repetitive behavior may end. Yet another technical solution is to determine a cycle in the original model associated with a cycle in the phase abstracted model in which a repetitive behavior may begin. Yet another technical solution is to determine a second repetitive behavior associated with a first repetitive behavior; the second repetitive behavior comprises less cycles than the first repetitive behavior; the first and second repetitive behaviors are comprised by a counter-example. Yet another technical solution is to determine a deterministic counter-example based on a non-deterministic counter-example associated with a liveness property. Yet another technical solution is to determine a deterministic counter-example using a satisfiability solver.

One technical effect of utilizing the disclosed subject matter is transforming an original liveness property to a phase abstracted liveness property. Another technical effect of utilizing the disclosed subject matter is transforming an original fairness property to a phase abstracted fairness property. Yet another technical solution of utilizing the disclosed subject matter is determining a counter-example based on an original counter-example generated in respect to a liveness property and a phase abstracted model.

Figure 1:
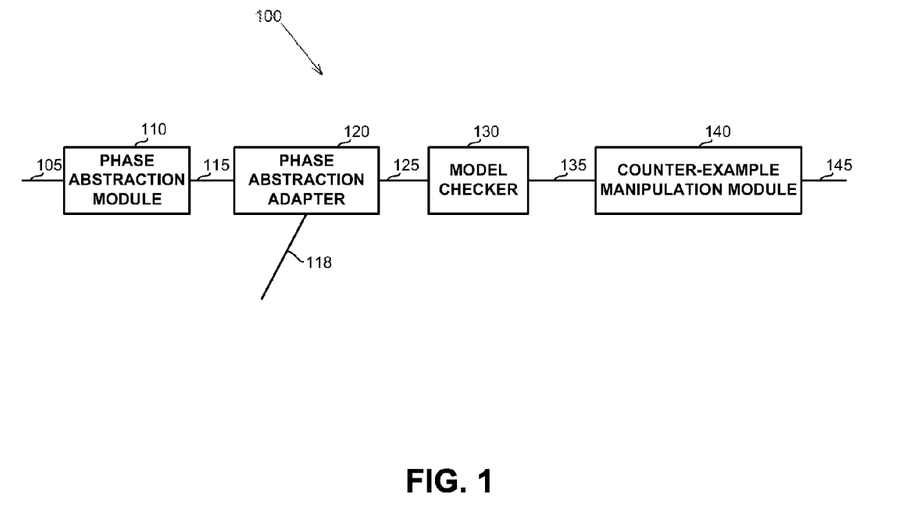
FIG. 1 shows a computerized environment in which the disclosed subject matter is used, in accordance with some exemplary embodiments of the subject matter.

Referring now to FIG. 1 showing a computerized environment in which the disclosed subject matter is used, in accordance with some exemplary embodiments of the subject matter.

A computerized environment 100 may comprise a phase abstraction module 110 which may transform an original model 105 to a phase abstracted model 115. A cycle in the phase abstracted model 115, also referred to as a frame, is associated with a predetermined number of cycles in the original model 105, such as for example four cycles. For a first register in the original model 105 the phase abstracted model 115 may comprise several registers associated with the first register. The several registers may represent a value of the first register in a frame. For example, in case the frame is four cycles, there may be four registers associated with the value of the first register, each corresponding to a different cycle in the frame, such as the first cycle of every frame, the second cycle of every frame and the like. A gate in the phase abstracted model associated with another gate in the original model in a cycle of a frame is also referred to as an unfolded gate.

The computerized environment 100 may comprise a phase abstraction adapter 120 configured to adapt an original liveness property 118 in accordance with the phase abstracted model 115. The phase abstraction adapter 120 may determine a phase abstracted liveness property 125. In some exemplary embodiments, the phase abstraction adapter 120 may further transform the phase abstracted model 115 to preserve an original fairness property.

The computerized environment 100 may comprise a model checker 130 utilized for model checking the phase abstracted model 115 in respect to the phase abstracted liveness property 125. The model checker 130 may determine that a model preserves the phase abstracted liveness property 125. The model checker 130 may alternatively determine that the model does not preserve the phase abstracted liveness property 125. The model checker may further determine an original counter-example 135 exemplifying a behavior of the phase abstracted model 115 which does not comply with the phase abstracted liveness property 125. In some exemplary embodiments, the model checker 130 is a BDD-based model checker, a SAT-solver based model checker or the like. The model checker 130 may be a third-party model checker that is not specifically configured to handle with phase abstracted models.

The computerized environment 100 may comprise a counter-example manipulation module 140 for modifying the original counter-example to a modified counter-example 145. The modified counter-example 145 may exemplify a behavior of the original model 105 that does not comply with the original liveness property 118, also referred to as a falsification of the original liveness property 118.

In some exemplary embodiments of the disclosed subject matter, some of the aforementioned elements of the computerized system 100 may be coupled, such as for example the counter-example manipulation module 140 and the phase abstraction adapter 120 may be implemented by a single computerized device, such as software/firmware executed using Personal Computer (PC), a server, or other hardware, a specialized computerized hardware or the like.

Figure 2:
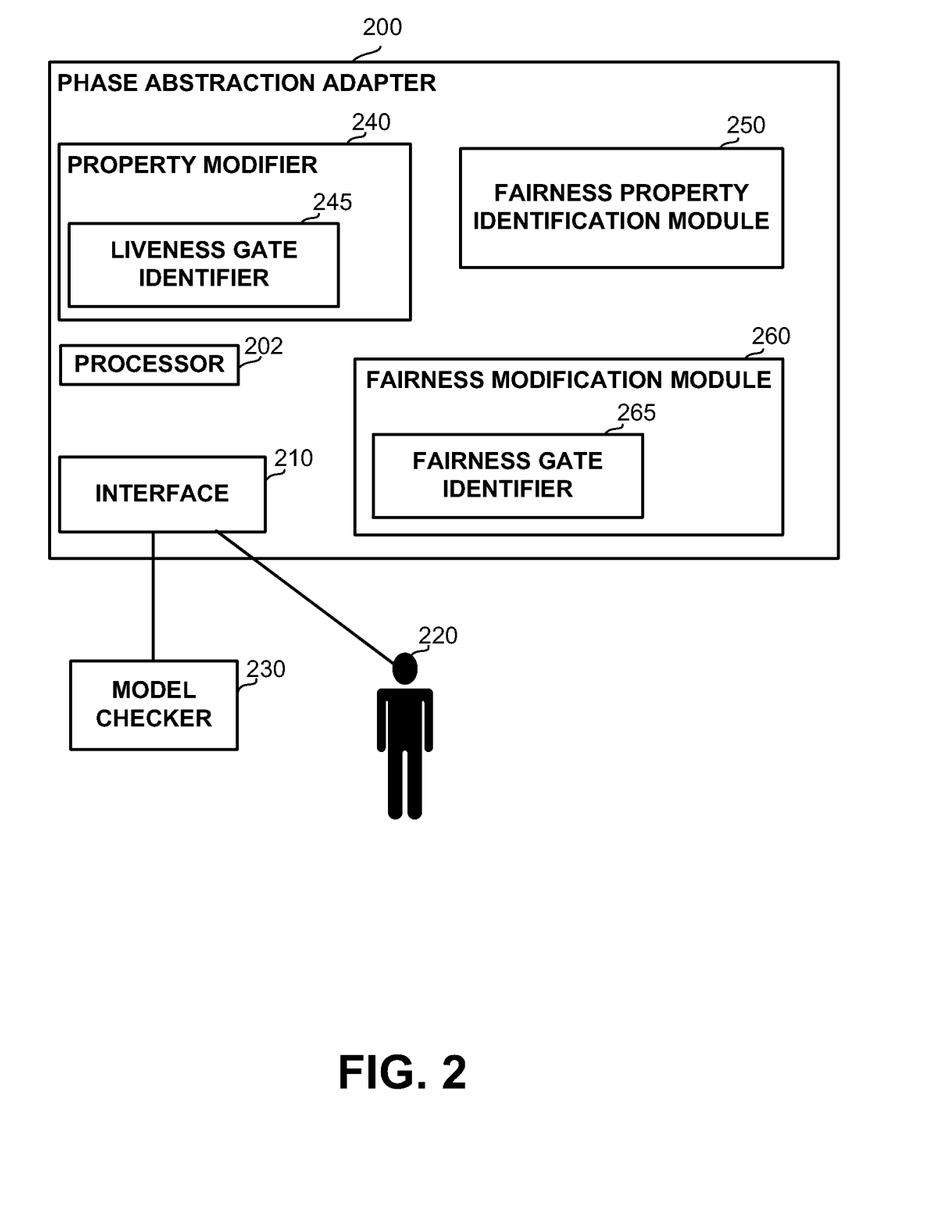
FIG. 2 shows a block diagram of a phase abstraction adapter, in accordance with some exemplary embodiments of the disclosed subject matter.

Referring now to FIG. 2 showing a phase abstraction adapter in accordance with some exemplary embodiments of the disclosed subject matter. A phase abstraction adapter 200, such as 120 of FIG. 1, may comprise a processor 202. The processor 202 may be a Central Processing Unit (CPU), a microprocessor, an electronic circuit, an Integrated Circuit (IC) or the like. The processor 202 may be utilized to perform computations required by the phase abstraction adapter 200 or any of it subcomponents.

The phase abstraction adapter 200 may comprise an interface 210. The interface 210 may be utilized to receive or otherwise obtain a phase abstracted model, an original liveness property or the like. The interface 210 may be an Application Programming Interface (API), a communication protocol, an input or output device or the like. The interface 210 may obtain information from a user 220, a model checker 230 or a phase abstraction module (not shown), such as 110 of FIG. 1, and the like. The interface 210 may further provide output interface to the phase abstraction adapter 200 enabling it to provide the user 220, the model checker 230 or the like any determination, information, data, computation or the like produced by the phase abstraction adapter 200.

The phase abstraction adapter 200 may comprise a property modifier 240 configured to transform an original liveness property to a phase abstracted liveness property. In some exemplary embodiments, the property modifier 240 may comprise a liveness gate identifier 245 configured to identify one or more unfolded gates in the phase abstracted model that are associated with the original liveness property. The one or more unfolded gates may be associated with a gate in the original model that is associated with the original liveness property.

In some exemplary embodiments, an original liveness property is refuted by exemplifying a behavior in which a value of a gate remains TRUE. The property modifier 240 may determine the phase abstracted liveness property to be a conjunction of the one or more unfolded gates in the phase abstracted model.

The phase abstraction adapter 200 may comprise a fairness property identification module 250 for identifying or otherwise determining an original fairness property. The fairness property identification module 250 may determine a definition in a model that defines a fairness property such as for example a fairness directive in PSL/Sugar specification language.

The phase abstraction adapter 200 may comprise a fairness modification module 260 for modifying or otherwise transforming the original fairness property to a phase abstracted fairness property. In some exemplary embodiments, the fairness modification module 260 may comprise a fairness gate identifier 265 configured to identify one or more unfolded gates in the phase abstracted model that are associated with the original fairness property. The one or more unfolded gates may be associated with a gate in the original model that is associated with the original fairness property.

In some exemplary embodiments, an original fairness property is held by having a predetermined gate be TRUE in at least one cycle in a repetitive portion of a counter-example. The fairness modification module 260 may determine the phase abstracted fairness property be a disjunction of one or more unfolded gates associated with the predetermined gate.

Figure 3:
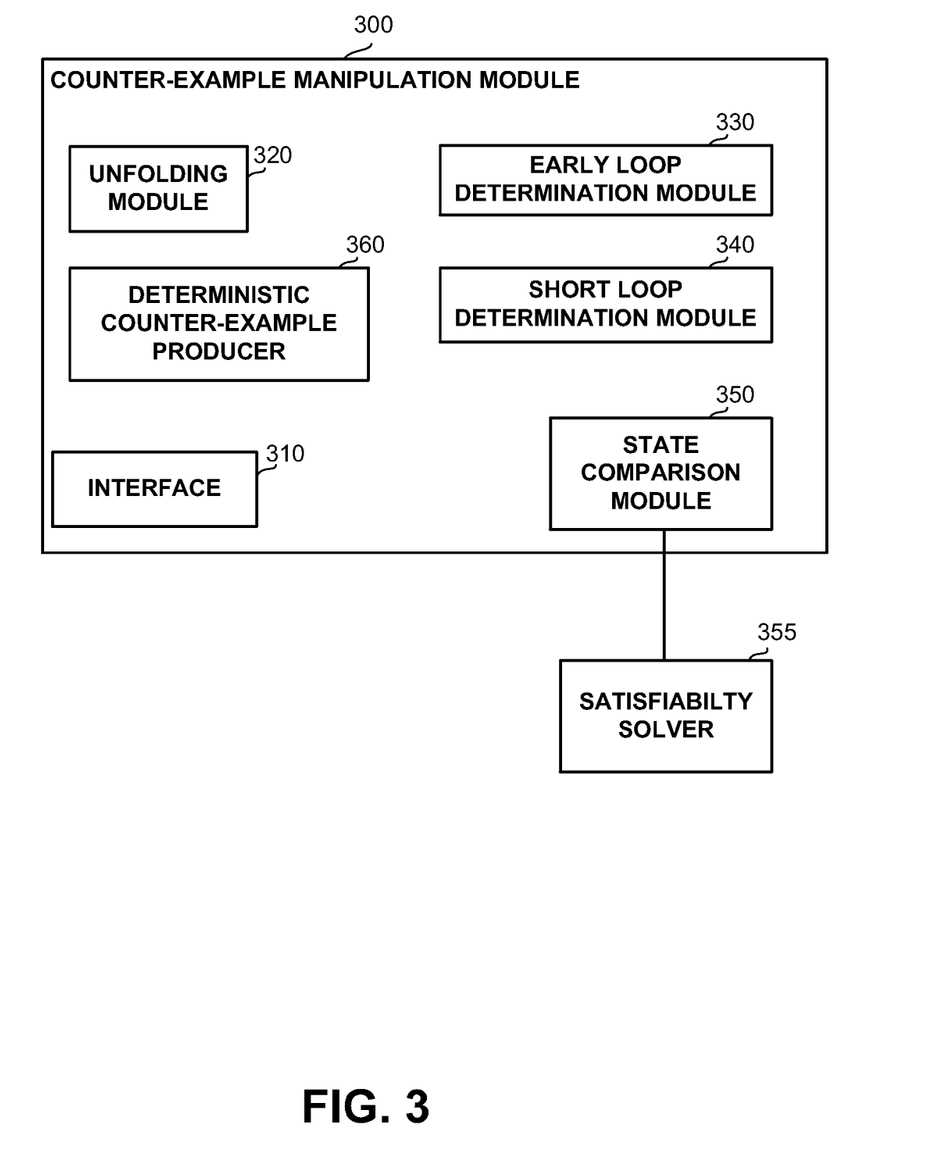
FIG. 3 shows a counter-example manipulation module, in accordance with some exemplary embodiments of the disclosed subject matter.

Referring now to FIG. 3 showing a counter-example manipulation module, in accordance with some exemplary embodiments of the disclosed subject matter. A counter-example manipulation module 300, such as 140 of FIG. 1, may be configured to transform an original counter-example to a modified counter-example. The original counter-example may be produced or otherwise determined by a model checker in respect to the phase abstracted model and the phase abstracted liveness property. The modified counter-example may be associated with the original model and the original liveness property.

The counter-example manipulation module 300 may comprise an interface 310, similar to 210 of FIG. 2. The interface 310 may be utilized to receive or otherwise obtain the original counter-example, for example from a model checker. The interface 310 may be utilized to output the modified counter-example.

The counter-example manipulation module 300 may comprise an unfolding module 320 for determining a value of a gate in a cycle in the modified counter-example based on a value of a corresponding gate in corresponding cycle in the original counter-example. For example, the unfolding module 320 may determine the value of the gate in the original model the be the value of an unfolded gate in the phase abstracted model. The unfolding module 320 may perform an iterative process in which each a value of a gate is determined in each cycle to be the value of an unfolded gate. For example, in case a frame comprises four cycles, a value of a gate in cycle ten is set to a value of a third unfolded gate in the second cycle of the phase adapted model, as the second cycle of the phase adapted model represents cycles eight to eleven in the original model.

In some exemplary embodiments, the unfolding module 320 may truncate the modified counter-example such that the modified counter-example comprise a loop. The truncation may be performed on the last cycle in the original counter-example, such that only some of the cycles corresponding to the frame of the last cycle appear in the modified counter-example.

The counter-example manipulation module 300 may comprise an early loop determination module 330. The early loop determination module 330 may determine a first cycle in the original model that is equal to a second cycle in the original model which corresponds to a beginning of a loop. The first cycle is earlier than the second cycle. The first cycle may be determined to be a beginning cycle of the loop in the modified counter-example, thereby providing a loop that begins in an earlier cycle.

The counter-example manipulation module 300 may comprise a short loop determination module 340. The short loop determination module 340 may determine a first cycle in the original model such that a second cycle in the original model which corresponds to a beginning of a loop is successive to the first cycle. The first cycle may be determined to be an ending cycle of the modified counter-example, thereby providing a loop comprising fewer cycles.

The counter-example manipulation module 300 may comprise a state comparison module 350 that may compare a first cycle and a second cycle in the original model. The comparison may be based on the values in the original counter-example, and a determination of values of gates in the original model based on the value of unfolded gates in the phase abstracted model.

In some exemplary embodiments of the disclosed subject matter, a deterministic counter-example producer 360 may determine a deterministic counter-example based on an original counter-example which is non-deterministic. The deterministic counter-example producer 360 may determine a deterministic value for each gate having a non-deterministic value, such as by employing a satisfiability solver 355 or by selecting an arbitrary deterministic value.

In some exemplary embodiments of the disclosed subject matter, the state comparison module 350 may utilize the satisfiability solver 355 to determine if two states, of which at least one is non-deterministic, may represent a same state. The satisfiability solver 355 may be a Constraint Satisfaction Problem (CSP) solver, a Boolean satisfiability (SAT) solver, a theorem prover, a Quantified Boolean Formula (QBF) solver or the like.

Figure 4:
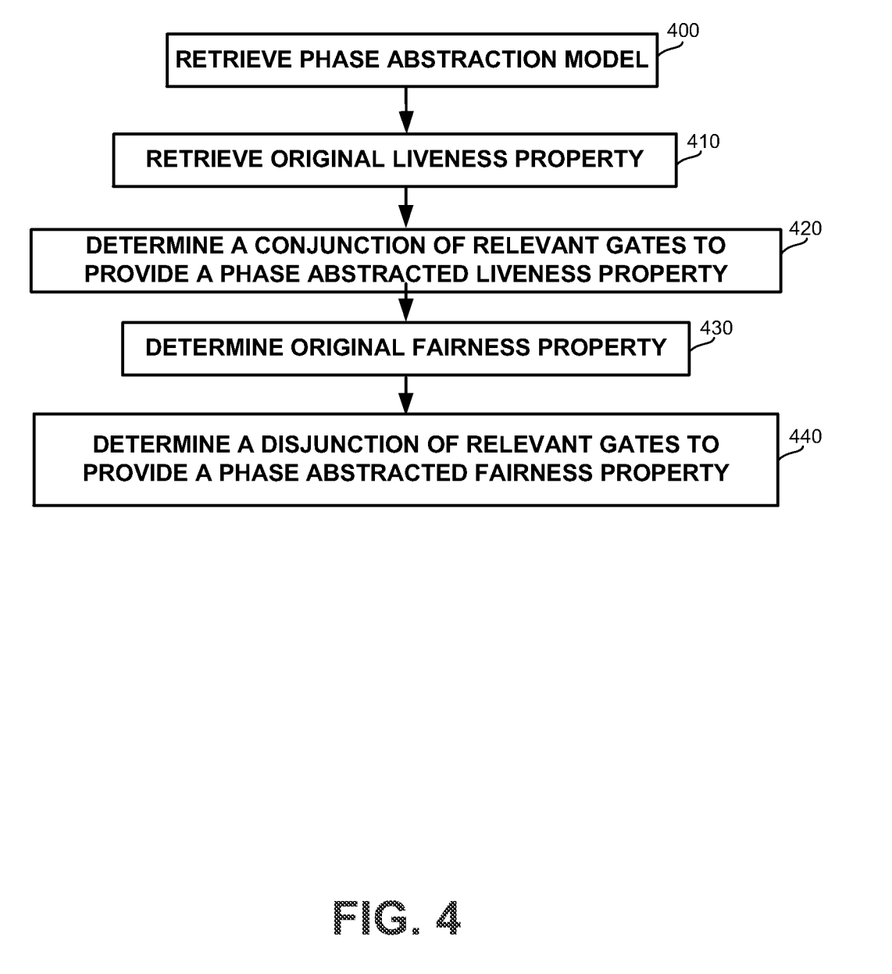
FIG. 4 shows a flowchart diagram of a method to determine a phase abstracted property, in accordance with some exemplary embodiments of the disclosed subject matter.

Referring now to FIG. 4 showing a flowchart diagram of a method to determine a phase abstracted property, in accordance with some exemplary embodiments of the disclosed subject matter.

In step 400, a phase abstracted model is retrieved or otherwise obtained, using for example an interface such as 210 of FIG. 2.

In step 410, an original liveness property is retrieved or otherwise obtained, using for example an interface such as 210 of FIG. 2.

In step 420, a conjunction of relevant gates in the phase abstracted model is determined. The conjunction may be of unfolded gates relating to liveness gates in the original model. Liveness gates refer to one or more gates that are associated with a liveness property, such as the original liveness property. The conjunction may be used to determine and provide for a phase abstracted liveness property.

In step 430, an original fairness property is determined, for example by a fairness property identification module 250 of FIG. 2.

In step 440, a disjunction of relevant gates in the phase abstraced model is determined. The disjunction may be of unfolded gates relating to fairness gates in the original model. Fairness gates refer to one or more gates that are associated with fairness property, such as the original fairness property. The disjunction may be used to determine and provide for a phase abstracted fairness property. In some exemplary embodiments, the phase abstracted model is modified to include the phase abstracted fairness property. In other exemplary embodiments, the phase abstracted fairness property is provided to a model checker using a specification language describing the specification.

Figure 5:
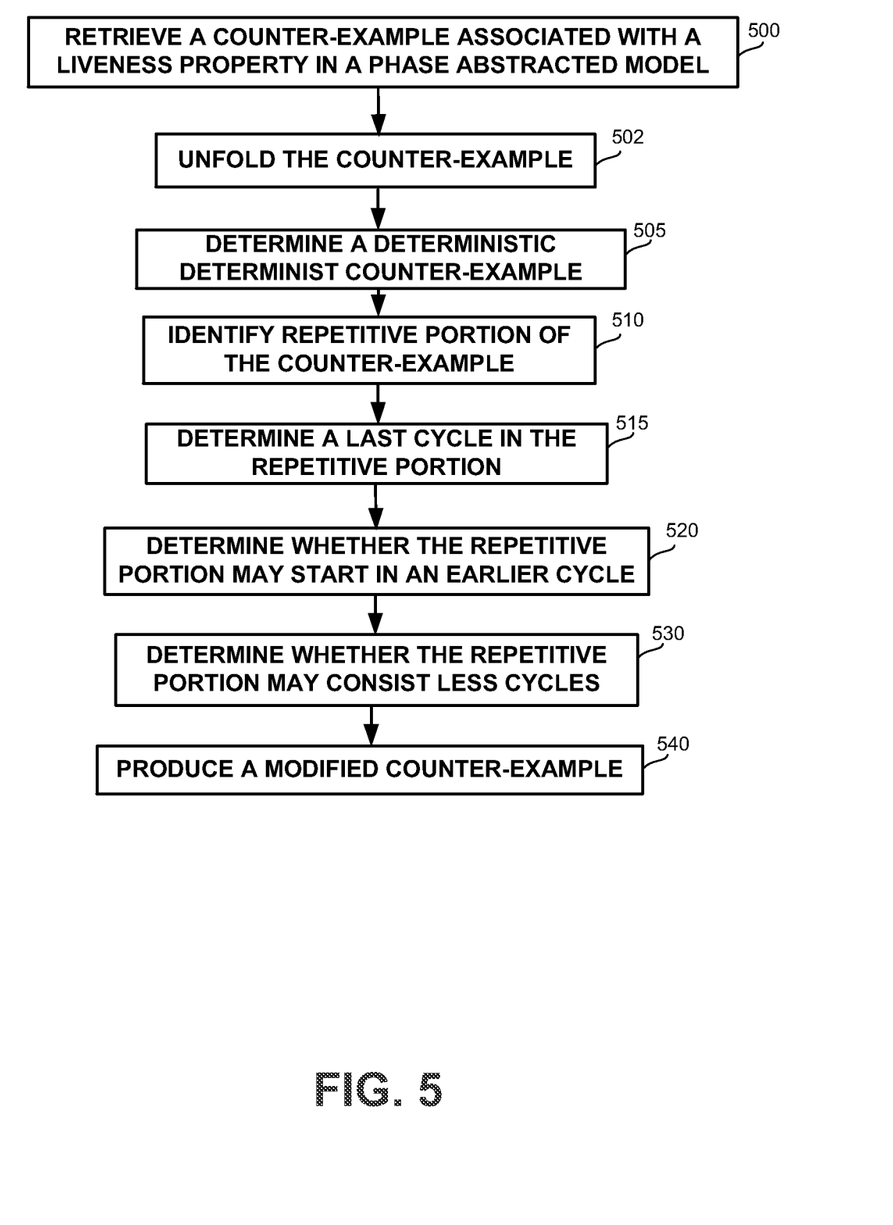
FIG. 5 shows a flowchart diagram of a method to determine a modified counter-example, in accordance with some exemplary embodiments of the disclosed subject matter.

Referring now to FIG. 5 showing a flowchart diagram of a method to determine a modified counter-example, in accordance with some exemplary embodiments of the disclosed subject matter.

In step 500, an original counter-example associated with a liveness property is retrieved or otherwise obtained, using for example an interface such as 310 of FIG. 3. The original counter-example exemplifies a falsification of a phase abstracted liveness property by a phase abstracted model.

In step 502, the original counter-example is unfolded to an unfolded counter-example. The unfolded counter-example is associated with the original model. Step 502 may be performed by an unfolding module such as 320 of FIG. 3. In some exemplary embodiment, step 502 is performed by iterating over unfolded gates in the phase abstracted model associated with a gate in the original model and for each frame in the original counter-example copy the value of the M-th unfolded gate to the value of the gate at cycle M−1+I*K, where I is the frame and K is a number of cycles in a frame. Step 502 may produce an unfolded counter-example In some exemplary embodiments, a deterministic counter-example is determined in step 505 based on the unfolded counter-example. A deterministic counter-example producer such as 360 of FIG. 3 may be utilized.

In step 510, a repetitive portion of the original counter-example is identified. In some exemplary embodiments, the counter-example comprises a LOOP gate that is raised upon entering to the repetitive portion. A corresponding portion in the unfolded counter-example may be determined to be a repetitive portion.

In step 515, a determination may be made as to which cycle should be the last cycle of the unfolded counter-example in order to ensure that a correct loop appears in the unfolded counter-example. In some exemplary embodiments, the last K cycles of the unfolded counter-example are examined, where K is a number of cycles in a frame. The last K cycles may be examined to determine which of the K states in the K cycles is a predecessor state of the first state of the repetitive portion of the unfolded counter-example. The determined predecessor state may be determined to be the last cycle of the unfolded counter-example. The cycles after the last cycle may be removed from the unfolded counter-example.

In step 520, a determination may be made whether the repetitive portion may start in an earlier cycle in the unfolded counter example. Step 520 may be performed by an early loop determination module such as 330 of FIG. 3. In some exemplary embodiments, some cycles before the repetitive portion are examined to determine if any of the some cycles is equal to the cycle beginning the repetitive portion. Alternatively, the some cycles may be examined to determine if they are the next state successive (according to the original model) to the state in the last cycle of the unfolded counter-example. If a cycle is identified, the unfolded counter-example may be modified such that the repetitive portion may begin in the cycle.

In step 530, a determination may be made whether the repetitive portion of the unfolded counter example may consist less cycles. Step 530 may be performed by a short loop determination module such as 340 of FIG. 3. In some exemplary embodiments, cycles of the repetitive portion may be examined to determine if a state in a first cycle is equal to the state in the ending cycle of the repetitive portion. Alternatively, a determination may be made whether the state beginning the repetitive portion is a next state successive to the state in the first cycle. If a first cycle is identified, the unfolded counter-example may be modified such that the repetitive portion may end in the first cycle.

In step 540, the modified counter-example may be produced or otherwise determined based on the unfolded counter-example and the determination made in any of the previous steps.

In some exemplary embodiments of the disclosed subject matter, a satisfiability solver, such as a SAT solver, may be utilized to determine the modified counter-example. In an exemplary embodiment, any non-deterministic state in the unfolded counter-example is examined using the satisfiability solver to determine if it could represent a state in accordance with a cycle. The satisfiability solver may be utilized, for example, in steps 520 or 530. In case the satisfiability solver determines that a satisfactory assignment exists, the satisfactory assignment may be utilized to determine deterministic values for the non-deterministic state. The satisfiability solver enables decreasing the size of the modified counter-example such that the repetitive portion begins in an early cycle or consists of a small number of cycles.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computerized system comprising:
a processor;
an interface for receiving a phase abstracted model, the phase abstracted model is a result of a phase abstraction transformation on an original model having an original transition relation, wherein a transition relation of the phase abstracted model represents a plurality of transitions using the original transition relation;
an interface for receiving an original liveness specification property that is to be held by the original model;
a property modifier for transforming the original liveness specification property to a phase abstracted liveness specification property in accordance with the phase abstraction transformation, wherein the transformation is based on the phase abstracted model, wherein a falsification by the phase abstracted model of the phase abstracted liveness specification property corresponds to a falsification by the original model of the original liveness specification property; and
a counter-example manipulation module for transforming an original counter-example to a modified counter-example, the original counter-example exemplifies a falsification of the phase abstracted liveness specification property in respect to the phase abstracted model, the modified counter-example exemplifies a falsification of the original liveness specification property in respect to the original model.

2. The computerized system of claim 1, wherein the phase abstracted model is a result of a phase abstraction on an original model; and wherein said property modifier comprises a liveness gate identifier for determining a portion of the phase abstracted model associated with the original liveness specification property.

3. The computerized system of claim 1 further comprising:
a fairness property identification module for determining an original fairness property; and
a fairness modification module for transforming the original fairness property to a phase abstracted fairness property.

4. The computerized system of claim 1, wherein the original counter-example is produced by a model checker.

5. The computerized system of claim 1, wherein said counter-example manipulation module comprising:
an interface for receiving the original model;
an interface for receiving the original counter-example;
an unfolding module for determining a first value associated with a first gate of the original model based on a second value associated with a second gate, the original counter-example comprising the second value of the second gate.

6. The computerized system of claim 5, wherein said counter-example manipulation module further comprising a short loop determination module.

7. The computerized system of claim 5, wherein said counter-example manipulation module further comprising an early loop determination module.

8. The computerized system of claim 5, wherein said counter-example manipulation module further comprising a state comparison module.

9. The computerized system of claim 8, wherein said state comparison module is configured to utilize a satisfiability solver.

10. The computerized system of claim 9 wherein the satisfiability solver is selected from the group consisting of a SAT solver, a theorem prover, a QBF solver and a CSP solver.

11. The computerized system of claim 5, wherein said counter-example manipulation module further comprising a deterministic counter-example producer configured to transform a non-deterministic counter-example to a deterministic counter-example.

12. A method comprising:
retrieving a phase abstracted model, the phase abstracted model is a result of a phase abstraction transformation on an original model having an original transition relation, wherein a transition relation of the phase abstracted model represents a plurality of transitions using the original transition relation;
retrieving an original liveness specification property that is to be held by the original model;
transforming the original liveness specification property to a phase abstracted liveness specification property in accordance with the phase abstraction transformation, wherein said transformation is based on the phase abstracted model, wherein a falsification by the phase abstracted model of the phase abstracted liveness specification property corresponds to a falsification by the original model of the original liveness specification property; said transforming is performed using a processor and
transforming an original counter-example to a modified counter-example, the original counter-example exemplifies a falsification of the phase abstracted liveness specification property in respect to the phase abstracted model, the modified counter-example exemplifies a falsification of the original liveness specification property in respect to the original model.

13. The method of claim 12 wherein said transforming the original liveness specification property to the phase abstracted liveness specification property comprising determining a portion of the phase abstracted model associated with the original liveness specification property.

14. The method of claim 12 further comprising:
determining an original fairness property; and
transforming the original fairness property to a phase abstracted fairness property
whereby the phase abstracted model is transformed to assure satisfaction of the original fairness property.

15. The method of claim 12, wherein said transforming the original counter-example to the modified counter-example comprising:
receiving the original model;
receiving the original counter-example;
determining a first value associated with a first gate of the original model based on a second value associated with a second gate, the original counter-example comprising the second value of the second gate.

16. The method of claim 12, wherein said transforming the original counter-example to the modified counter-example comprising shortening a repetitive behavior; and initiating repetitive behavior in an early cycle.

17. The method of claim 12, wherein said transforming the original counter-example to the modified counter-example comprising comparing a first state and a second state; said comparing a first state and a second state utilizes a satisfiability solver.

18. The method of claim 12, wherein said transforming the original counter-example to the modified counter-example comprising transforming a non-deterministic counter-example to a deterministic counter-example.

19. A computer program product comprising:
a non-transitory computer readable medium;
first program instruction for retrieving a phase abstracted model, the phase abstracted model is a result of a phase abstraction transformation on an original model having an original transition relation, wherein a transition relation of the phase abstracted model represents a plurality of transitions using the original transition relation;
second program instruction for retrieving an original liveness specification property that is to be held by the original model;
third program instruction for transforming the original liveness specification property to a phase abstracted liveness specification property in accordance with the phase abstraction transformation, wherein said transformation is based on the phase abstracted model, wherein a falsification by the phase abstracted model of the phase abstracted liveness specification property corresponds to a falsification by the original model of the original liveness specification property;
wherein said first, second and third program instructions are stored on said non-transitory computer readable medium; and
fourth program instruction for transforming an original counter-example to a modified counter-example, the original counter-example exemplifies a falsification of the phase abstracted liveness specification property in respect to the phase abstracted model, the modified counter-example exemplifies a falsification of the original liveness specification property in respect to the original model.

20. The computer program product of claim 19, wherein said third program instruction comprises
fourth program instruction for receiving the original model;
fifth program instruction for receiving the original counter-example;
sixth program instruction for determining a first value associated with a first gate of the original model based on a second value associated with a second gate, the original counter-example comprising the second value of the second gate.

* * * * *